United States Patent
Lin

(10) Patent No.: US 10,123,442 B1
(45) Date of Patent: Nov. 6, 2018

(54) HIGH POWER DENSITY POWER SUPPLY

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 15/883,062

(22) Filed: Jan. 29, 2018

(51) Int. Cl.
*H05K 7/14* (2006.01)
*H05K 7/20* (2006.01)

(52) U.S. Cl.
CPC ....... *H05K 7/1417* (2013.01); *H05K 7/20909* (2013.01)

(58) Field of Classification Search
CPC ............. H05K 7/1417; H05K 7/20909; H05K 7/20136–7/20163; H05K 7/2089; H05K 7/20918
USPC ................ 361/695–697, 734, 763, 821, 830; 363/141; 257/721–722; 174/547–548; 165/80.3
See application file for complete search history.

(56) References Cited

U.S. PATENT DOCUMENTS

| 6,320,776 | B1* | 11/2001 | Kajiura | H02M 7/003 361/709 |
| 9,713,280 | B2* | 7/2017 | Lai | H05K 7/1432 |
| 2004/0061992 | A1* | 4/2004 | Roman | H02M 7/003 361/601 |
| 2008/0037219 | A1* | 2/2008 | Chen | H05K 7/20909 361/695 |
| 2008/0080135 | A1* | 4/2008 | Franz | H05K 7/20727 361/695 |
| 2011/0188280 | A1* | 8/2011 | Nagano | H05K 7/20918 363/141 |
| 2015/0296653 | A1* | 10/2015 | Mathieu | H05K 7/20918 361/690 |
| 2017/0150654 | A1* | 5/2017 | Kubo | H02M 7/003 |
| 2017/0265329 | A1* | 9/2017 | Dixit | H05K 7/20327 |
| 2018/0174731 | A1* | 6/2018 | Fukuchi | H01L 23/36 |
| 2018/0206361 | A1* | 7/2018 | Shirakami | H05K 7/20145 |

* cited by examiner

*Primary Examiner* — Dion R Ferguson
*Assistant Examiner* — Amir Jalali
(74) *Attorney, Agent, or Firm* — Ming Chow; Sinorica, LLC

(57) ABSTRACT

A high power density power supply includes a plurality of cooling fans in a casing. Two sides of the cooling fans are provided with a first filter circuit board and a plurality of power modules, respectively. The first filter circuit board includes a first filter thereon. A plurality of second filter circuit boards are provided on top of the cooling fans, respectively.
A second filter is disposed beneath each of the second filter circuit boards. The first filter, the second filter and the power modules are staggered each other, which takes advantage of the upper and lower spaces of the power supply to provide a good heat flow path so that the cooling fans can perform heat dissipation effectively for the power modules. The high power density power supply can achieve a better cooling effect in the casing of the same size.

5 Claims, 7 Drawing Sheets

HIGH POWER DENSITY POWER SUPPLY

FIELD OF THE INVENTION

The present invention relates to a high power density power supply, and more particularly to a high power density power supply which integrates power modules with filters in a casing.

BACKGROUND OF THE INVENTION

In general, a power supply is composed of a power switch component (such as a power transistor, a power diode, etc.), an electrical energy storage, and a filter component (such as an inductor, a capacitor, a transformer, a choke coil, etc.), and a detection and control component. Thereby, the voltage or current is adjusted (switched and rectified) by the detection and control component to control the power switch component. The electric energy storage and the filter component provide the required filtering and temporary electrical energy storage for converting the electric energy. However, during the power conversion, part of the energy supplied from the power supply is converted into heat energy. The heat energy is concentrated in the power transistor.

The demand for power supplies used for industrial is extremely large. The power supply is mounted to a chassis through a rack. A general business gathers power supplies and servers in a computer room to facilitate management. The power supplies and the servers are running all day long. Therefore, the heat dissipation of the power supplies is particularly important. For the convenience of management and space saving, the casing for the rack-type power inverter usually adopts a common industrial standard, its width is fixed at 19 inches, height in U units (1 U=1.75 inches=44.45 mm). The standard casings are usually 1 U, 2 U, 3 U, and others. In general, at the same power, the power inverter composed of a power switch component, a power storage, and a filter component, and a detection and control component needs better heat dissipation conditions, so it is necessary to use a larger casing, such as a casing of 3 U or more.

However, the input voltage of the above power supply is usually limited to 220V or 380V. The industry develops a general-purpose power supply of 180-460V. However, because the power supply needs more electronic components and is larger in size and the condition for heat dissipation is more strict, it often results in poor heat dissipation The reason is that the internal space of the casing is small and the electronic components block the wind blowing of the fan, which cannot provide a smooth heat dissipation path. As a result, the heat dissipation of the power transistors disposed at the rear is poor. The power supply may stop running or fail or be damaged due to overheating. Accordingly, the inventor of the present invention has devoted himself based on his many years of practical experiences to solve these problems.

SUMMARY OF THE INVENTION

The primary object of the present invention is to provide a high power density power supply which integrates power modules with filters in a casing of the power supply and has a better heat flow path to achieve a better cooling effect.

In order to achieve the aforesaid object, the high power density power supply of the present invention comprises a casing. The casing has a panel at a front side thereof. The high power density power supply further comprises a plurality of power modules, a first filter circuit board, and a plurality of second filter circuit boards. The power modules are arranged side by side in the casing in a direction perpendicular to the panel. A front side of each of the power modules is provided with a cooling fan. The first filter circuit board is disposed in the casing and located in front of the cooling fans of the power modules. The first filter circuit board includes a first filter thereon. The second filter circuit boards are disposed in the casing. The second filter circuit boards are fixedly connected to top ends of the cooling fans of the power modules, respectively. A second filter is disposed beneath each of the second filter circuit boards. One side of each of the second filter circuit boards, facing the first filter circuit board, is provided with a plurality of first conductive plates extending downward. Bottoms of the first conductive plates are fixedly connected to the first filter circuit board so that the second filter circuit boards are electrically connected to the first filter circuit board. Another side of each of the second filter circuit boards, facing a corresponding one of the power modules, is provided with a plurality of second conductive plates extending downward. Bottoms of the second conductive plates are fixedly connected to the corresponding power modules so that the second filter circuit boards are electrically connected to the corresponding power modules respectively.

In the present invention, the first filter, the second filter and the power modules are staggered each other, which takes advantage of the upper and lower spaces of the power supply to provide a good heat flow path so that the cooling fans can perform heat dissipation effectively for the power modules. The present invention can achieve a better cooling effect in the casing of the same size.

DETAILED DESCRIPTION OF THE PREFERRED EMBODIMENTS

Embodiments of the present invention will now be described, by way of example only, with reference to the accompanying drawings.

Figure 1:
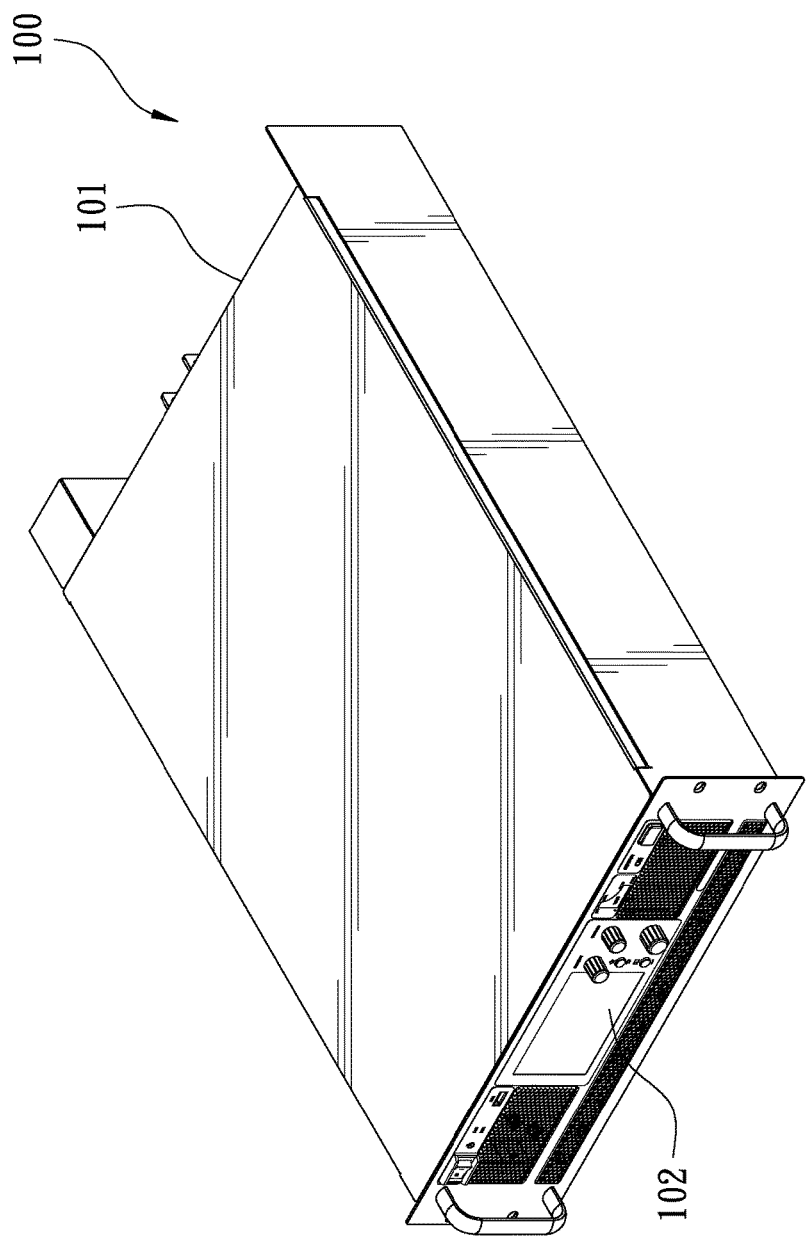
FIG. 1 is a perspective view of the power supply of the present invention.

FIG. 1 is a perspective view of the power supply of the present invention. The present invention discloses a high power density power supply 100. The high power density power supply 100 comprises a casing 101. The casing 101 has a panel 102 at a front side thereof. The high power density power supply 100 further comprises a plurality of power modules 10, a first filter circuit board 20, and a plurality of second filter circuit boards 30.

Figure 2:
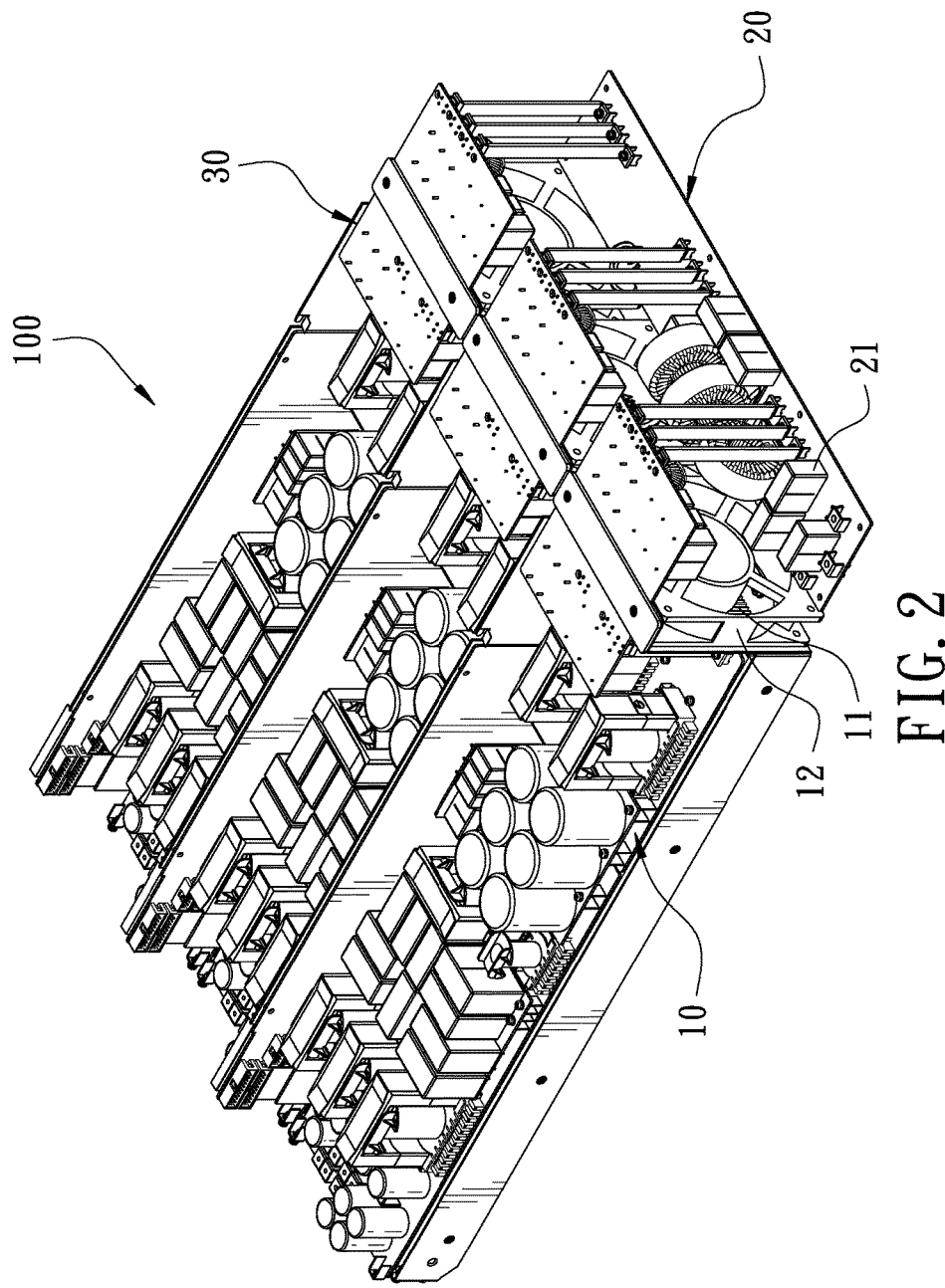
FIG. 2 is a perspective view of the interior of the casing of the present invention.
Figure 3:
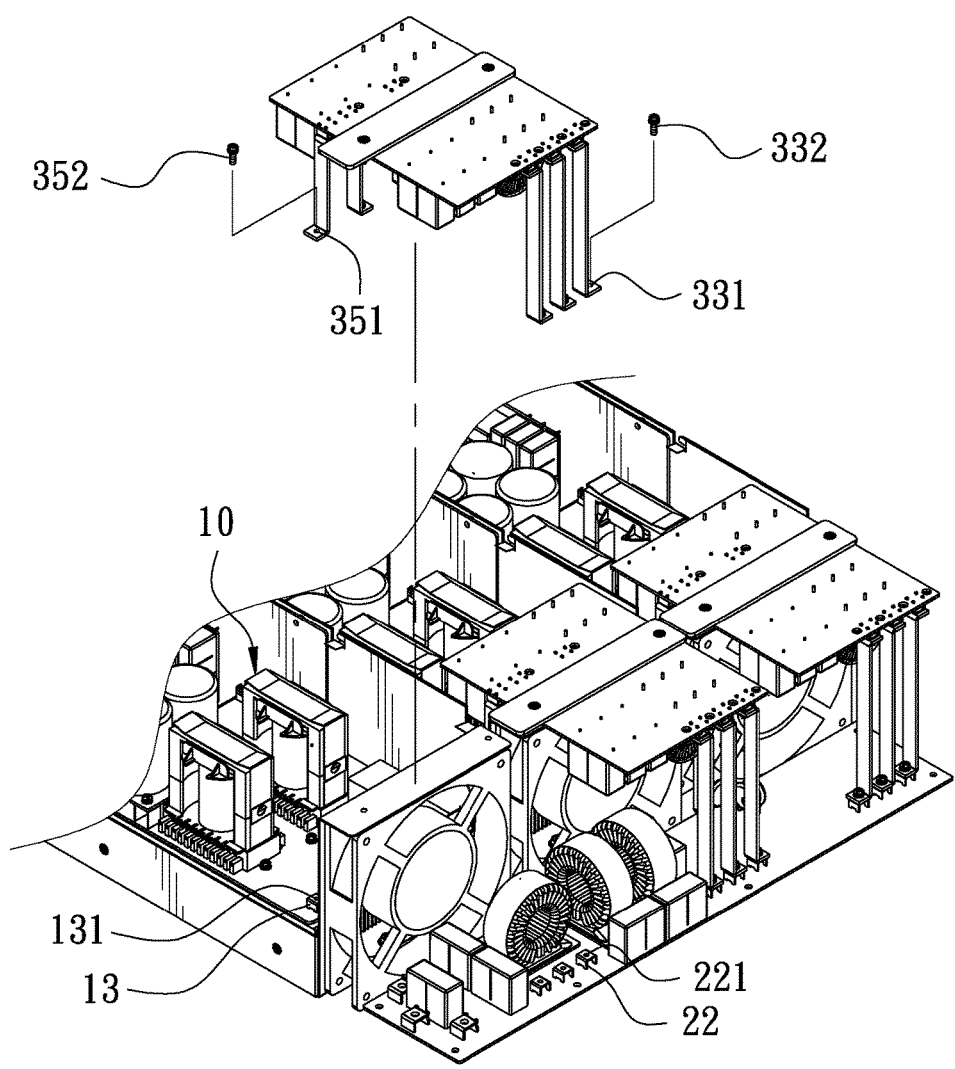
FIG. 3 is a partial exploded view of the interior of the casing of the present invention.

FIG. 2 is a perspective view of the interior of the casing of the present invention. FIG. 3 is a partial exploded view of the interior of the casing of the present invention. The power modules 10 are arranged side by side in the casing 101 in a direction perpendicular to the panel 102. A plurality of cooling fins 11 are provided under the power modules 10. A front side of each power module 10 is provided with a cooling fan 12. The cooling fan 12 is located at a front side of the cooling fins 11. That is, the size of the cooling fan 12 is to cover the electronic components on the power module 10 and the corresponding cooling fin 11 under the power module 10. In addition, the power modules 10 are provided with a plurality of third locking seats 13. Each of the third locking seats 13 has a third locking hole 131.

The first filter circuit board 20 is disposed in the casing 101 and located in front of the cooling fans 12. A first filter 21 having differential mode inductance is disposed on the first filter circuit board 20. The filter circuit board 20 is provided with a plurality of first locking seats 22. Each of the first locking seats 22 has a first locking hole 221.

Figure 4:
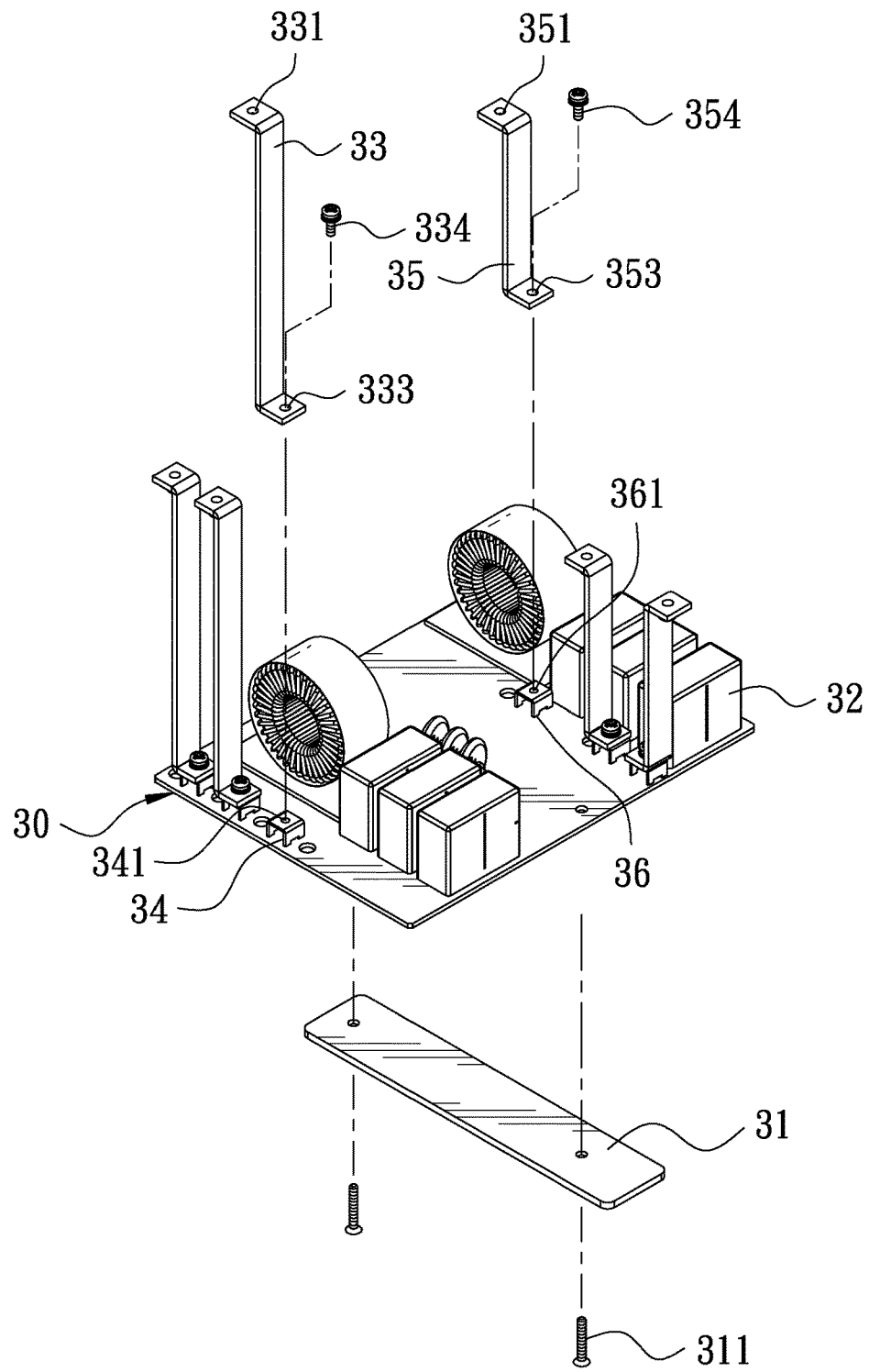
FIG. 4 is an enlarged exploded view of the second filter circuit board of the present invention.

The second filter circuit boards 30, referring to FIG. 4, are disposed in the casing 101. An insulating plate 31 is provided on top of each of the second filter circuit boards 30. The insulating plate 31 fastens each of the second filter circuit boards 30 to the corresponding cooling fan 12 through two locking members 311. A second filter 32 having differential mode inductance is disposed beneath each of the second filter circuit boards 30. One side of each second filter circuit board 30, facing the first filter circuit board 20, is provided with a plurality of first conductive plates 33 extending downward. The bottoms of the first conductive plates 33 are fixedly connected to the first filter circuit board 20. A first end of each of the first conductive plates 33 has a first through hole 331 corresponding to the first locking hole 221 for a first bolt 332 to pass through the first through hole 331 and the first locking hole 221, so that the first end of each of the first conductive plates 33 is fixed to the first filter circuit board 20. Each of the second filter circuit boards 30 is provided with a second locking seat 34 corresponding to a second end of each of the first conductive plates 33. The second locking seat 34 has a second locking hole 341. Each of the first conductive plates 33 has a second through hole 333 corresponding to the second locking hole 341 for a second bolt 334 to pass through the second through hole 333 and the second locking hole 341, so that the second ends of the first conductive plates 33 are fixed to the second filter circuit boards 30. The second filter circuit boards 30 are electrically connected to the first filter circuit board 20. Another side of each second filter circuit board 30, facing a corresponding one of the power modules 10, is provided with a plurality of second conductive plates 35 extending downward. The bottoms of the second conductive plates 35 are fixedly connected to the corresponding power modules 10. A first end of each of the second conductive plates 35 has a third through hole 351 corresponding to the third locking hole 131 for a third bolt 352 to pass through the third through hole 351 and the third locking hole 131, so that the first ends of the second conductive plates 35 are fixed to the power modules 10. Each of the second filter circuit boards 30 is provided with a fourth locking seat 36 corresponding to a second end of each of the second conductive plates 35. The fourth locking seat 36 has a fourth locking hole 361. Each of the second conductive plates 35 has a fourth through hole 353 corresponding to the fourth locking hole 361 for a fourth bolt 354 to pass through the fourth through hole 353 and the fourth locking hole 361, so that the second ends of the second conductive plates 35 are fixed to the second filter circuit boards 30. The second filter circuit boards 30 are electrically connected to the corresponding power modules 10, respectively.

Figure 5:
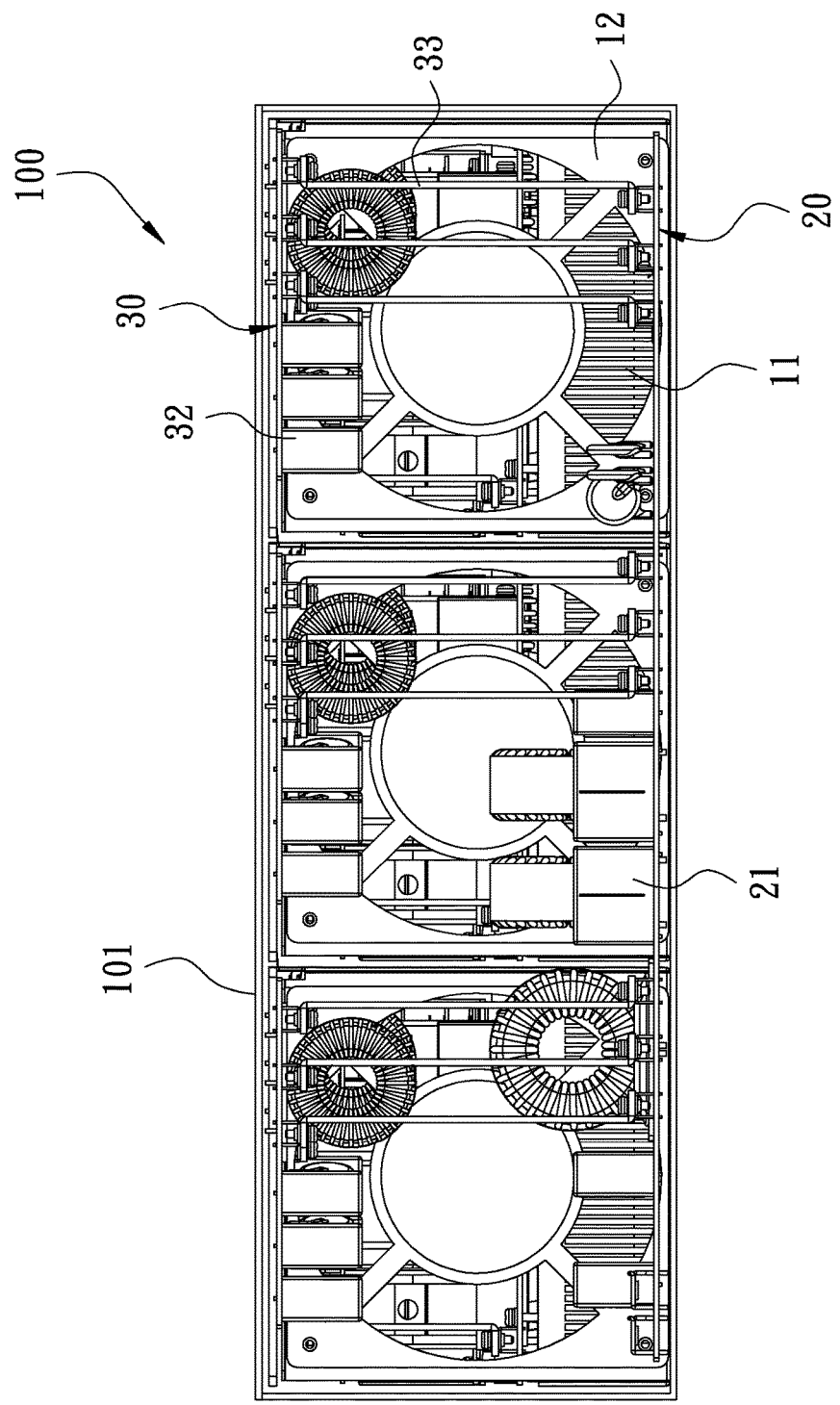
FIG. 5 is a front view of the present invention without the panel.
Figure 6:
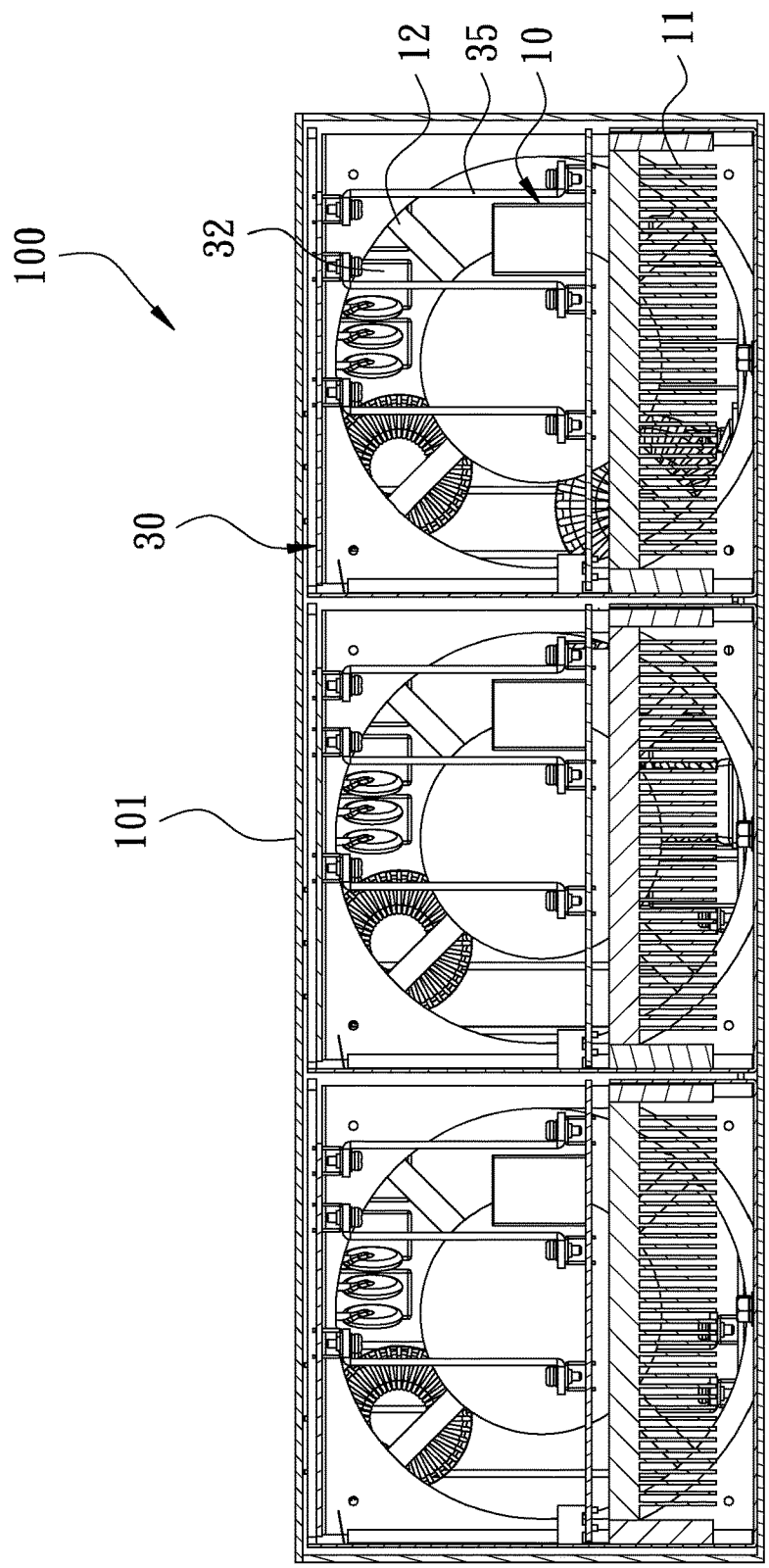
FIG. 6 is a sectional view of the present invention.
Figure 7:
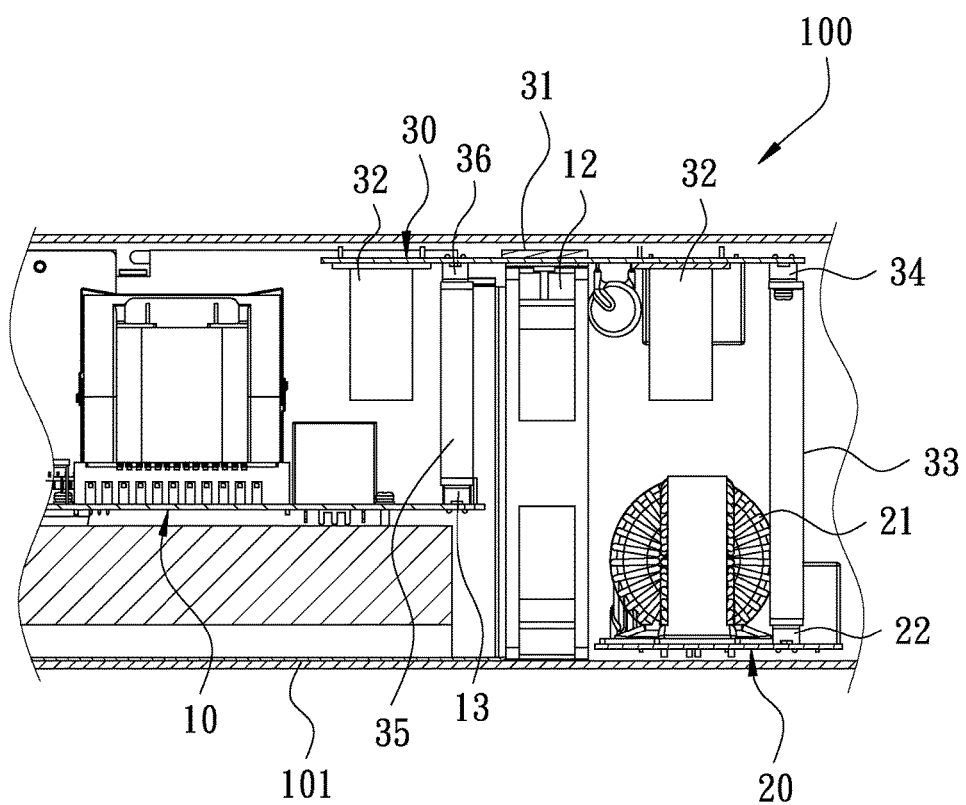
FIG. 7 is a lateral sectional view of the present invention.

FIG. 5 is a front view of the present invention. FIG. 6 is a sectional view of the present invention. FIG. 7 is a lateral sectional view of the present invention. The first filter 21, the second filter 32 and the power modules 10 are staggered each other, fully taking advantage of the upper and lower spaces of the power supply 100. When the power supply 100 is started, the external current is first filtered by the first filter circuit board 20 to reduce electromagnetic interference (EMI). Then, the current flows through the first conductive plates 33 to the second filter circuit boards 30 to perform a second filtering to stabilize the quality of the current, and then the current flows through the second conductive plates 35 to the power modules 10 for the power modules 10 to output the required current and voltage. Since the first filter 21, the second filter 32 and the power modules 10 generate heat in operation, the cooling fans 12 can be used for heat dissipation. Because the first filter 21, the second filter 32 and the power modules 10 are staggered each other, the cooling fans 12 can blow the wind to the power modules 10. The present invention can achieve a better cooling effect in the existing casing 101, that is, in the same casing, the present invention can be applied to a universal power supply of 180-460V. The high power density power supply has a greater power output.

1. In the present invention, the second filter circuit boards 30 are disposed above the cooling fans 12. The first filter 21, the second filter 32 and the power modules 10 are staggered each other to provide a good heat flow path so as not to obstruct the wind of the cooling fans 12, so that the power modules 10 and the cooling fins 11 thereof can dissipate heat via the wind, fully taking advantage of the upper and lower spaces of the power supply 100.

2. Since the first filter 21, the second filters 32 and the power modules 10 are staggered each other so that the cooling fans 12 can blow the wind to the power modules 10 disposed at the rear of the power supply, The present invention can still achieve excellent heat dissipation in the casing 101, for example, a 3 U height casing under certain specifications. That is, in the same casing, the present invention can be installed with a universal power input of 180-460V up to 15 KW and high-power power modules and filters and has an excellent cooling effect.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A high power density power supply, comprising a casing, the casing having a panel at a front side thereof, characterized in that the high power density power supply further comprises a plurality of power modules, a first filter circuit board and a plurality of second filter circuit boards;

the power modules are arranged side by side in the casing in a direction perpendicular to the panel, a front side of each of the power modules is provided with a cooling fan;

the first filter circuit board is disposed in the casing and located in front of the cooling fans of the power modules, the first filter circuit board includes a first filter thereon;

the second filter circuit boards are disposed in the casing, the second filter circuit boards are fixedly connected to top ends of the cooling fans of the power modules respectively, a second filter is disposed beneath each of the second filter circuit boards, one side of each of the second filter circuit boards, facing the first filter circuit board, is provided with a plurality of first conductive plates extending downward, bottoms of the first conductive plates are fixedly connected to the first filter circuit board so that the second filter circuit boards are electrically connected to the first filter circuit board, another side of each of the second filter circuit boards, facing a corresponding one of the power modules, is provided with a plurality of second conductive plates extending downward, and bottoms of the second conductive plates are fixedly connected to the corresponding power modules so that the second filter circuit boards are electrically connected to the corresponding power modules respectively.

2. The high power density power supply as claimed in claim 1, wherein an insulating plate is provided on top of each of the second filter circuit boards, and the insulating plate fastens each of the second filter circuit boards to the cooling fan through two locking members.

3. The high power density power supply as claimed in claim 1, wherein the filter circuit board is provided with a plurality of first locking seats corresponding to respective first ends of the first conductive plates, each of the first locking seats has a first locking hole, each of the first conductive plates has a first through hole corresponding to the first locking hole for a first bolt to pass through the first through hole and the first locking hole so that the first ends of the first conductive plates are fixed to the first filter circuit board, each of the second filter circuit boards is provided with a second locking seat corresponding to a second end of each of the first conductive plates, the second locking seat has a second locking hole, and each of the first conductive plates has a second through hole corresponding to the second locking hole for a second bolt to pass through the second through hole and the second locking hole so that the second ends of the first conductive plates are fixed to the second filter circuit boards.

4. The high power density power supply as claimed in claim 1, wherein the power modules are provided with a plurality of third locking seats corresponding to respective first ends of the second conductive plates, each of the third locking seats has a third locking hole, each of the second conductive plates has a third through hole corresponding to the third locking hole for a third bolt to pass through the third through hole and the third locking hole so that the first ends of the second conductive plates are fixed to the power modules, each of the second filter circuit boards is provided with a fourth locking seat corresponding to a second end of each of the second conductive plates, the fourth locking seat has a fourth locking hole, and each of the second conductive plates has a fourth through hole corresponding to the fourth locking hole for a fourth bolt to pass through the fourth through hole and the fourth locking hole so that the second ends of the second conductive plates are fixed to the second filter circuit boards.

5. The high power density power supply as claimed in claim 1, wherein a plurality of cooling fins are provided under the power modules, and the cooling fans of the power modules are located at a front side of the cooling fins.

* * * * *